United States Patent
Long

(10) Patent No.: US 11,863,172 B2
(45) Date of Patent: Jan. 2, 2024

(54) SINGLE LIVE LINE SWITCH CIRCUIT AND CONTROL METHOD THEREOF

(71) Applicant: Joulwatt Technology Co., Ltd., Hangzhou (CN)

(72) Inventor: Hao Long, Hangzhou (CN)

(73) Assignee: JOULWATT TECHNOLOGY CO., LTD., Hangzhou (CN)

( * ) Notice: Subject to any disclaimer, the term of this patent is extended or adjusted under 35 U.S.C. 154(b) by 143 days.

(21) Appl. No.: 17/334,854

(22) Filed: May 31, 2021

(65) Prior Publication Data

US 2022/0311440 A1  Sep. 29, 2022

(30) Foreign Application Priority Data

Mar. 25, 2021 (CN) .......................... 202110319517.7

(51) Int. Cl.
*H03K 17/76* (2006.01)
*H03K 17/567* (2006.01)
*H03K 17/68* (2006.01)

(52) U.S. Cl.
CPC .......... *H03K 17/76* (2013.01); *H03K 17/567* (2013.01); *H03K 17/68* (2013.01)

(58) Field of Classification Search
CPC ...... H03K 17/00; H03K 17/567; H03K 17/68; H03K 17/76; H05B 45/00; H05B 45/3725; H05B 45/40; Y02B 20/00; Y02B 20/30; Y02B 20/40

USPC .......................................................... 307/139
See application file for complete search history.

(56) References Cited

U.S. PATENT DOCUMENTS

| | | | |
|---|---|---|---|
| 2010/0176661 A1* | 7/2010 | Wilson ................. | H05B 47/185 307/114 |
| 2015/0189721 A1* | 7/2015 | Karc ..................... | H05B 47/19 315/246 |
| 2020/0335983 A1* | 10/2020 | Long .................... | H02M 3/158 |

* cited by examiner

*Primary Examiner* — Diana J. Cheng
(74) *Attorney, Agent, or Firm* — Bayramoglu Law Offices LLC

(57) ABSTRACT

A single live line switch circuit includes a single live line connecting end, a switch unit, two wire channels, an on-state power obtaining circuit, an off-state power obtaining circuit, and an energy storage element. The single live line connecting end is connected to an external single live line. The on-state power obtaining circuit is connected to the single live line connecting end. The switch unit includes a fixed connecting end and a movable connecting end, and the fixed connecting end is connected to the on-state power obtaining circuit. The two wire channels are provided with a first connecting end and a second connecting end, respectively, and the movable connecting end of the switch unit is in contact with the first connecting end or the second connecting end. A control method of the single live line switch circuit is provided.

15 Claims, 1 Drawing Sheet

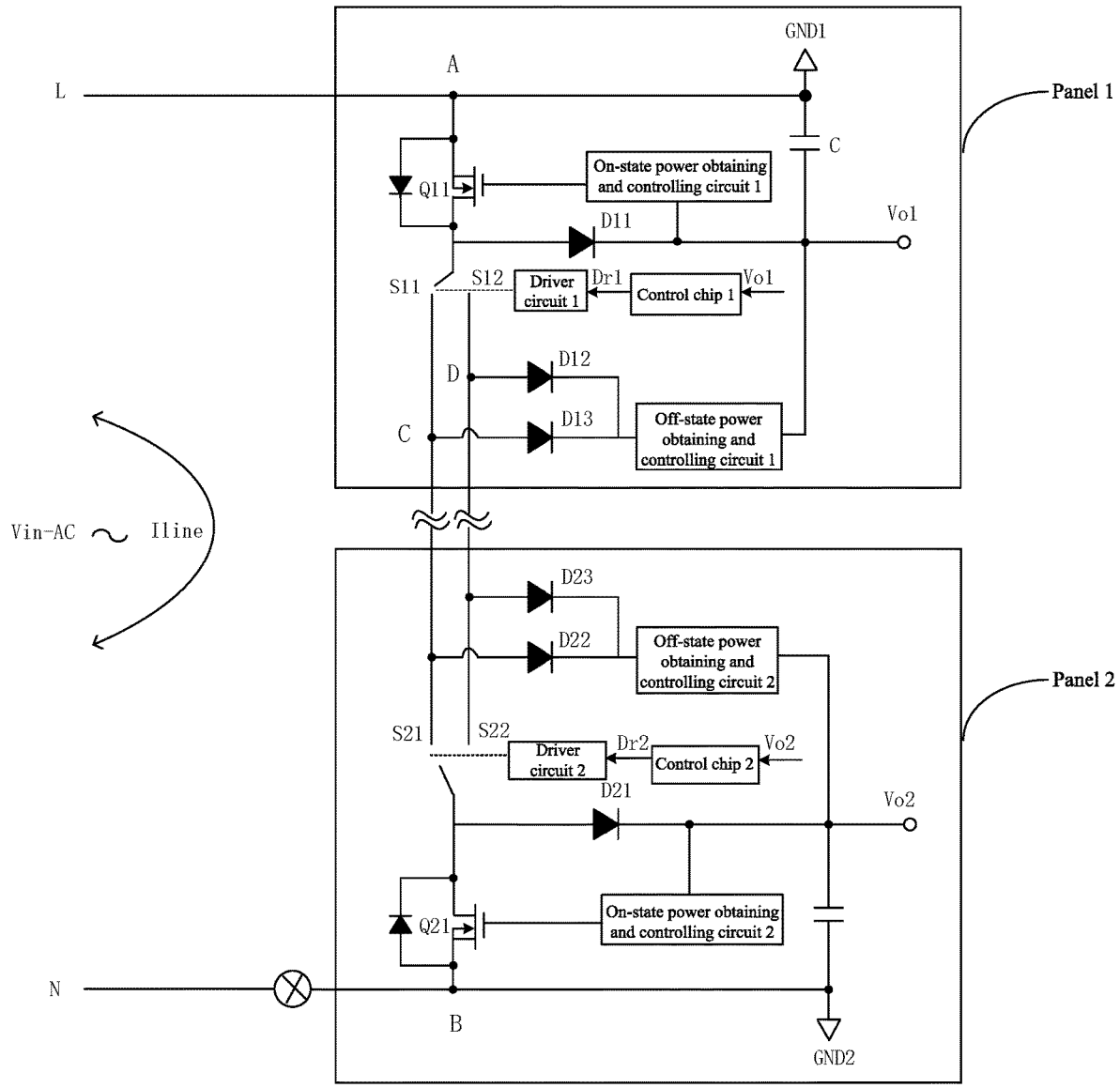

SINGLE LIVE LINE SWITCH CIRCUIT AND CONTROL METHOD THEREOF

CROSS REFERENCE TO THE RELATED APPLICATIONS

This application is based upon and claims priority to Chinese Patent Application No. CN202110319517.7, filed on Mar. 25, 2021, the entire contents of which are incorporated herein by reference.

TECHNICAL FIELD

The present invention relates to the technical field of electrical circuitry and switches, and more particularly, relates to a single live line switch circuit and a control method thereof.

BACKGROUND

With the rapid popularization of intelligent homes, control switches for lighting home or office areas are gradually becoming intelligent. Traditional lighting control generally uses mechanical switch panel, and control chips in the switch panel, such as the integrated single chip microcomputer, low power WiFi and wireless module, needed to ensure reliable use of electricity.

In existing buildings, in many situations it is necessary to control the lighting load to be turned on or off at different locations, such as within a room, a door and bedside, but the wiring of the switch box in the mechanical switch panel mostly utilize a single live line connection. Thus, when the traditional switch panel is upgraded with the intelligent switch panel, it is necessary to improve or optimize the single live line switch circuit. Otherwise, the control circuit of the single live line switch panel may not receive power under control schemes where two or more panels are used.

SUMMARY

In view of the above, an objective of the present invention is to provide a single live line switch circuit to solve the technical problem existing in the prior art that the control circuit of the intelligent switch panel cannot obtain power at different switch locations.

The present invention adopts the following technical solutions. A single live line switch circuit is provided. A switch circuit includes a single live line connecting end, a first switch unit, two wire channels, an on-state power obtaining circuit, an off-state power obtaining circuit, and an energy storage element. The single live line connecting end is connected to an external single live line. The on-state power obtaining circuit is connected to the single live line connecting end. The first switch unit includes a fixed connecting end and a movable connecting end, and the fixed connecting end is connected to the on-state power obtaining circuit. The two wire channels are provided with a first connecting end and a second connecting end, respectively, and the movable connecting end of the first switch unit is in contact with the first connecting end or the second connecting end. The off-state power obtaining circuit is connected to nodes on the two wire channels, respectively. When the single live line switch circuit controls a load to be turned on, the on-state power obtaining circuit stores energy for the energy storage element. When the single live line switch circuit controls the load to be turned off, the off-state power obtaining circuit stores energy for the energy storage element.

Preferably, the on-state power obtaining circuit includes a second switch, an on-state power obtaining and controlling circuit, and a first conducting element. A first end of the second switch is connected to the single live line connecting end, and a second end of the second switch is connected to the fixed connecting end of the first switch unit. The on-state power obtaining and controlling circuit is connected to the energy storage element, and the on-state power obtaining and controlling circuit is connected to a control end of the second switch to control a switching state of the second switch. The first conducting element is connected between the second end of the second switch and the energy storage element.

Preferably, the second switch includes a field effect transistor, or the second switch includes a bipolar transistor and a diode. Preferably, the off-state power obtaining circuit includes a second conducting element, a third conducting element, and an off-state power obtaining and controlling circuit. One end of the second conducting element and one end of the third conducting element are connected to the nodes on the two wire channels, respectively. The other end of the second conducting element and the other end of the third conducting element are both connected to the off-state power obtaining and controlling circuit, and an output end of the off-state power obtaining and controlling circuit is connected to the energy storage element.

Preferably, the single live line connecting end is an input end of a single live line or an output end of the single live line.

Preferably, the single live line switch circuit further includes a driver circuit and a control chip. The energy storage element provides a working voltage to the control chip. The control chip generates a switch control signal and transmits the switch control signal to the driver circuit to control a switching state of the first switch unit.

Preferably, the single live line switch circuit further includes a switch panel. The switch panel is provided with a panel indication mark corresponding to the first switch unit, and the indication mark is communicated with the control chip to control the movable connecting end of the first switch unit to be connected to one of the first connecting end and the second connecting end.

According to a second aspect of the present invention, a single live line switch circuit includes two switch circuits connected between the input end of the single live line and the output end of the single live line. Each switch circuit includes a single live line connecting end, a first switch unit, two wire channels, an on-state power obtaining circuit, an off-state power obtaining circuit, and an energy storage element. The on-state power obtaining circuit is connected to the single live line connecting end. The first switch unit includes a fixed connecting end and a movable connecting end, and the fixed connecting end is connected to the on-state power obtaining circuit. The two wire channels are provided with a first connecting end and a second connecting end, respectively, and the movable connecting end of the first switch unit is in contact with the first connecting end or the second connecting end. The off-state power obtaining circuit is connected to nodes on the two wire channels, respectively. When the single live line switch circuit controls a load to be turned on, the on-state power obtaining circuit is configured to store energy for the energy storage element. When the single live line switch circuit controls the load to be turned off, the off-state power obtaining circuit is configured to store energy for the energy storage element. Single live line connecting ends of the two switch circuits are connected to the input end of the single live line and the output end of the single live line, respectively. Two wire channels of one of the two switch circuits are correspondingly connected to two wire channels of the other one of the two switch circuits to allow the two switch circuits to be connected between the input end of the single live line and the output end of the single live line.

Preferably, one of the two switch circuits is connected to the load.

Preferably, the two switch circuits control the load to be turned on or off at different times and different locations, respectively.

Preferably, each on-state power obtaining circuit includes a second switch, an on-state power obtaining and controlling circuit, and a first conducting element. A first end of the second switch is connected to the single live line connecting end, and a second end of the second switch is connected to the fixed connecting end of the first switch unit. The on-state power obtaining and controlling circuit is connected to the energy storage element, and the on-state power obtaining and controlling circuit is connected to a control end of the second switch to control a switching state of the second switch. The first conducting element is connected between the second end of the second switch and the energy storage element. The second switch includes a field effect transistor, or the second switch includes a bipolar transistor and a diode.

Preferably, each off-state power obtaining circuit includes a second conducting element, a third conducting element, and an off-state power obtaining and controlling circuit. One end of the second conducting element and one end of the third conducting element are connected to the nodes on the two wire channels, respectively. The other end of the second conducting element and the other end of the third conducting element are both connected to the off-state power obtaining and controlling circuit, and an output end of the off-state power obtaining and controlling circuit is connected to the energy storage element.

Preferably, each switch circuit further includes a driver circuit and a control chip. The energy storage element provides a working voltage to the control chip. The control chip generates a switch control signal and transmits the switch control signal to the driver circuit to control a switching state of the first switch unit.

According to a third aspect of the present invention, a control method of a single live line switch circuit is provided. The single live line switch circuit includes two switch circuits connected between an input end of a single live line and an output end of the single live line. Each switch circuit includes a single live line connecting end, a first switch unit, two wire channels, an on-state power obtaining circuit, an off-state power obtaining circuit, and an energy storage element. Single live line connecting ends of the two switch circuits are connected to the input end of the single live line and the output end of the single live line, respectively. Two wire channels of one of the two switch circuits are correspondingly connected to two wire channels of the other one of the two switch circuits to allow the two switch circuits to be connected between the input end of the single live line and the output end of the single live line.

When first switch units of the two switch circuits are connected to an identical wire channel of the two wire channels, both the two switch circuits obtain power through the on-state power obtaining circuit to charge the energy storage element. When the first switch units of the two switch circuits are connected to different wire channels of the two wire channels, both the two switch circuits obtain the power through the off-state power obtaining circuit to charge the energy storage element.

Preferably, the two switch circuits obtain the power in a positive half cycle and a negative half cycle of an external alternating current (AC) input received by the single live line switch circuit, respectively.

The circuit structure of the present invention is adopted to arrange and design the circuits in the switch panels. For applications where two switch panels control a lamp load, irrespective of what state one panel of the two switch panels is in, the other panel of the two switch panels can independently obtain power in either a switching-on state or a switching-off state, thereby realizing that the lamp load is controlled to be turned on or off independently by the switch panels at different places. The single live line switch circuit of the present invention improves and optimizes the intelligent switch without changing the structure of the original single live line and is effectively applied in intelligent home applications.

BRIEF DESCRIPTION OF THE DRAWINGS

FIGURE is a circuit block diagram of a single live line switch circuit according to the present invention.

DETAILED DESCRIPTION OF THE EMBODIMENTS

The preferred embodiments of the present invention will be described in detail below with reference to the drawings, but the present invention is not only limited to these embodiments. Any alternatives, modifications, equivalent methods and solutions made within the spirit and scope of the present invention shall fall within the scope of protection of the present invention.

In order to enable the public to have a thorough understanding of the present invention, specific details are described in the following preferred embodiments of the present invention, but those skilled in the art can fully understand the present invention without the depiction of these details.

In the following paragraphs, the present invention is described in detail by way of examples with reference to the drawings. It should be noted that the drawings all adopt a relatively simplified form and all use non-precise proportions, which are only aimed to conveniently and clearly assist in explaining the embodiments of the present invention.

FIGURE is a circuit block diagram of a single live line switch circuit according to the present invention. In an embodiment, the single live line switch circuit includes two switch circuits between an input end of a single live line and an output end of the single live line, such as the switch circuit 1 (denoted as "panel 1") and the switch circuit 2 (denoted as "panel 2") in FIGURE. Each switch circuit includes a single live line connecting end, a first switch unit, two wire channels, an on-state power obtaining circuit, an off-state power obtaining circuit, and an energy storage element. For example, in FIGURE, the single live line connecting end in panel 1 is point A, and the single live line connecting end in panel 2 is point B.

In an embodiment, the on-state power obtaining circuit is connected to the single live line connecting end. The first switch unit includes a fixed connecting end and a movable connecting end. The fixed connecting end is connected to the on-state power obtaining circuit. The two wire channels are provided with a first connecting end and a second connecting end, respectively. The movable connecting end of the first switch unit is in contact with the first connecting end or the second connecting end. The off-state power obtaining circuit is connected to nodes on the two wire channels, respectively. Herein, the first switch unit can be realized by an intelligently optimized relay or a double-throw switch. For example, the intelligently optimized relay is a movable connecting end with two contact points, and the two contact points are connected to the nodes on the two wire channels. When the single live line switch circuit controls a load to be turned on, the on-state power obtaining circuit is configured to store energy for the energy storage element. When the single live line switch circuit controls the load to be turned off, the off-state power obtaining circuit is configured to store energy for the energy storage element. The single live line connecting ends of the two switch circuits are connected to the input end (such as point A) of the single live line and the output end (such as point B) of the single live line, respectively. The two wire channels of one of the two switch circuits are correspondingly connected to the two wire channels of the other one of the two switch circuits, and the two wire channels are such as the channel 1 and the channel 2 in FIGURE, so that the two switch circuits are connected between the input end of the single live line and the output end of the single live line. The switching action of the first switch unit controls the load to be turned on or off.

In an embodiment, the on-state power obtaining circuit in each switch circuit includes the second switch Q11, the on-state power obtaining and controlling circuit 1, and a first conducting element such as the diode D11. Herein, the circuit in the panel 1 is taken as an example, the followings are the same. The first end of the second switch is connected to the single live line connecting end point A, and the second end of the second switch is connected to the fixed connecting end of the first switch unit. The on-state power obtaining and controlling circuit is connected to the energy storage element C1. The on-state power obtaining and controlling circuit is connected to the control end of the second switch Q11 to control a switching state of the second switch to further control the stabilization of the voltage of the energy storage element C1, so as to provide a stable power supply voltage to a control chip. The anode of the first diode is connected to the second end of the second switch, and the cathode of the first diode is connected to the energy storage element. Herein, the second switch Q11 includes a field effect transistor, or the second switch includes a bipolar transistor and a diode. Herein, the on-state power obtaining circuit has a conventional circuit structure, which includes a comparator, an error amplifier, a switch tube and other components. The second switch includes the field effect transistor, or the second switch includes the bipolar transistor and the diode.

In an embodiment, the off-state power obtaining circuit in each switch circuit includes a second conducting element such as the diode D12, a third conducting element such as the diode D13, and the off-state power obtaining and controlling circuit 1. The anode of the second diode D12 and the anode of the third diode D13 are respectively connected to the nodes on the two wire channels, such as points C and D in FIGURE. The cathode of the second diode D12 and the cathode of the third diode D13 are both connected to the off-state power obtaining and controlling circuit 1. The output end of the off-state power obtaining and controlling circuit 1 is connected to the energy storage element C1. The off-state power obtaining and controlling circuit 1 is configured to control the stabilization of the voltage of the energy storage element C1, so as to provide the stable power supply voltage to the control chip. Herein, the off-state power obtaining circuit has a conventional circuit structure, which includes a comparator, an error amplifier, a switch tube and other components.

In an embodiment, each single live line switch circuit further includes a driver circuit and a control chip, such as the driver circuit 1 and the control chip 1 in FIGURE. The energy storage element C1 provides a working voltage to the control chip, and the control chip generates a switch control signal and transmits the switch control signal to the driver circuit to control a switching state of the first switch unit. Herein, the control chip may include a single chip microcomputer, or a wireless control chip, or an microprogrammed control unit (MCU).

In an embodiment, the single live line switch circuit further includes a switch panel. The switch panel may be a panel fixed on the switch circuit, and may also be a wireless control panel. The switch panel is provided with a panel indication mark corresponding to the first switch unit, and the indication mark is communicated with the control chip. The user controls the load to be turned on or off through the indication mark. Herein, the panel indication mark may be a button, a touch button, a wireless button, a wireless touch button, and the like.

According to the structure of the above switch circuits, the basic principle of the present invention to control the load and obtain power is as follows. The movable connecting end of the first switch unit in the panel 1 is connected to either the channel 1 (denoted as "S11 is turned on") or the channel 2 (denoted as "S12 is turned on"), and the movable connecting end of the first switch unit in the panel 2 is connected to either the channel 1 (denoted as "S21 is turned on") or the channel 2 (denoted as "S22 is turned on"). The switching-on conditions and power obtaining situations in the four cases are analyzed below. In the case where S11 in the panel 1 is turned on, if S21 in the panel 2 is turned on, then the load is turned on, and both the panel 1 and the panel 2 obtain power through the on-state power obtaining circuit; and if S22 in the panel 2 is turned on, then the load is turned off, and both the panel 1 and the panel 2 obtain power through the off-state power obtaining circuit. For example, during the positive half cycle of the AC input power, the switch Q21 in the panel 2 is turned on, and the panel 2 obtains power through a pathway constituted by a body diode of the switch Q11 in the panel 1 and the switch Q21 in the panel 2; during the negative half cycle of the AC input power, the switch Q11 in the panel 1 is turned on, and the panel 1 obtains power through a pathway constituted by a body diode of the switch Q21 in the panel 2 and the switch Q11 in the panel 1. After that, the energy storage elements C1 and C2 are charged by a single live line electric energy to supply for the control chip or the driver circuit in the panel to use. In the case where S12 in the panel 1 is turned on, if S21 in the panel 2 is turned on, then the load is turned off, and both the panel 1 and the panel 2 obtain power through the off-state power obtaining circuit; and if S22 in the panel 2 is turned on, then the load is turned on, and both the panel 1 and the panel 2 obtain power through the on-state power obtaining circuit in the same way as above. Similarly, in the case where S21 or S22 in the panel 2 is turned on, both the panel 1 and the panel 2 can obtain power independently through the on-state power obtaining circuit or the off-state power obtaining circuit. In this way, it can be realized that the panel 1 and the panel 2 are controlled to obtain power independently, and that the lamp load is controlled to be turned on or off independently by the switch panels at different places. The single live line switch circuit of the present invention improves and optimizes the intelligent switch without changing the structure of the original single live line and is effectively applied in intelligent home applications.

The above mentioned embodiments do not constitute a limitation on the scope of protection of the technical solution of the present invention. Any modification, equivalent replacement, improvement and others made within the spirit and principle of the above embodiments shall fall within the scope of protection of the technical solution of the present invention.

What is claimed is:

1. A single live line switch circuit system comprising two switch circuits, each of the two switch circuits comprising a single live line connecting end, a switch unit, two wire channels, an on-state power obtaining circuit, an off-state power obtaining circuit, and an energy storage element; wherein
    the single live line connecting end is connected to an external single live line;
    the on-state power obtaining circuit is connected to the single live line connecting end;
    the switch unit comprises a fixed connecting end and a movable connecting end, and the fixed connecting end is connected to the on-state power obtaining circuit;
    the two wire channels are provided with a first connecting end and a second connecting end, respectively, and the movable connecting end of the switch unit is in contact with the first connecting end or the second connecting end; and
    the off-state power obtaining circuit is connected to nodes on the two wire channels, respectively;
    wherein the single live line switch circuit includes two switch panels; when the single live line switch circuit controls a load to be turned on, both of the two switch panels obtain power through the on-state power obtaining circuit and store the obtained power in the energy storage element; and
    when the single live line switch circuit controls the load to be turned off, both of the two switch panels obtain power through, the off-state power obtaining circuit and store the obtained power in the energy storage element.

2. The single live line switch circuit of claim 1, wherein the on-state power obtaining circuit comprises a switch, an on-state power obtaining and controlling circuit, and a first conducting element; wherein
    a first end of the switch is connected to the single live line connecting end, and a second end of the switch is connected to the fixed connecting end of the switch unit;
    the on-state power obtaining and controlling circuit is connected to the energy storage element, and the on-state power obtaining and controlling circuit is connected to a control end of the switch to control a switching state of the switch; and
    the first conducting element is connected between the second end of the switch and the energy storage element.

3. The single live line switch circuit of claim 2, wherein the switch comprises a field effect transistor, or the switch comprises a bipolar transistor and a diode.

4. The single live line switch circuit of claim 1, wherein the off-state power obtaining circuit comprises a second conducting element, a third conducting element, and an off-state power obtaining and controlling circuit; wherein
    a first end of the second conducting element and a first end of the third conducting element are connected to the nodes on the two wire channels, respectively;
    a second end of the second conducting element and a second end of the third conducting element are connected to the off-state power obtaining and controlling circuit; and
    an output end of the off-state power obtaining and controlling circuit is connected to the energy storage element.

5. The single live line switch circuit of claim 1, wherein the single live line connecting end is an input end of the external single live line or an output end of the external single live line.

6. The single live line switch circuit of claim 1, further comprising a driver circuit and a control chip; wherein
    the energy storage element provides a working voltage to the control chip; and
    the control chip generates a switch control signal and transmits the switch control signal the driver circuit to control a switching state of the switch unit.

7. The single live line switch circuit of claim 6, wherein
    each of the two switch panels is provided with a panel indication mark corresponding to the switch unit, and
    the panel indication mark is communicated with the control chip to control the movable connecting end of the switch unit to be connected to one of the first connecting end and the second connecting end.

8. A single live line switch circuit, comprising two switch circuits connected between an input end of a single live line and an output end of the single live line; wherein
    each switch circuit of the two switch circuits comprises a single live line connecting end, a switch unit, two wire channels, an on-state power obtaining circuit, an off-state power obtaining circuit, and an energy storage element; wherein
    the on-state power obtaining circuit is connected to the single live line connecting end;
    the switch unit comprises a fixed connecting end and a movable connecting end, and the fixed connecting end is connected to the on-state power obtaining circuit;
    the two wire channels are provided with a first connecting end and a second connecting end, respectively, and the movable connecting end of the switch unit is in contact with the first connecting end or the second connecting end;
    the off-state power obtaining circuit is connected to nodes on the two wire channels, respectively;
    wherein the single live line switch circuit includes two switch panels; when the single live line switch circuit controls a load to be turned on, both of the two switch panels obtain power through the on-state power obtaining circuit and store the obtained power in the energy storage element; and
    when the single live line switch circuit controls the load to be turned off, both of the two switch panels obtain power through the off-state power obtaining circuit and store the obtained power in the energy storage element;
    single live line connecting ends of the two switch circuits are connected to the input end of the single live line and the output end of the single live line, respectively; and
    two wire channels of a first switch circuit of the two switch circuits are correspondingly connected to two wire channels of a second switch circuit of the two switch circuits to allow the two switch circuits to be connected between the input end of the single live line and the output end of the single live line.

9. The single live line switch circuit of claim 8, wherein one of the two switch circuits is connected to the load.

10. The single live line switch circuit of claim 8, wherein the two switch circuits control the load to be turned on or off at different times and different locations, respectively.

11. The single live line switch circuit of claim 8, wherein the on-state power obtaining circuit of each switch circuit comprises a switch, an on-state power obtaining and controlling circuit, and a first conducting element; wherein a first end of the switch is connected to the single live line connecting end, and a second end of the switch is connected to the fixed connecting end of the switch unit;

the on-state power obtaining and controlling circuit is connected to the energy storage element, and the on-state power obtaining and controlling circuit is connected to a control end of the switch to control a switching state of the switch;

the first conducting element is connected between the second end of the switch and the energy storage element; and the switch comprises a field effect transistor, or the switch comprises a bipolar transistor and a diode.

12. The single live line switch circuit of claim 8, wherein the off-state power obtaining circuit of the each switch circuit comprises a second conducting element, a third conducting element, and an off-state power obtaining and controlling circuit; wherein a first end of the second conducting element and a first end of the third conducting element are connected to the nodes on the two wire channels, respectively;

a second end of the second conducting element and a second end of the third conducting element are connected to the off-state power obtaining and controlling circuit; and an output end of the off-state power obtaining and controlling circuit is connected to the energy storage element.

13. The single live line switch circuit of claim 8, wherein each switch circuit further comprises a driver circuit and a control chip;

the energy storage element provides a working voltage to the control chip; and the control chip generates a switch control signal and transmits the switch control signal to the driver circuit to control a switching state of the switch unit.

14. A control method of a single live line switch circuit, wherein the single live line switch circuit comprises two switch circuits connected between an input end of a single live line and an output end of the single live line; wherein the two switch circuits include two switch panels;

each switch circuit of the two switch circuits comprises a single live line connecting end, a switch unit, two wire channels, an on-state power obtaining circuit, an off-state power obtaining circuit, and an energy storage element;

single live line connecting ends of the two switch circuits are connected to the input end of the single live line and the output end of the single live line, respectively;

two wire channels of a first switch circuit of the two switch circuits are correspondingly connected to two wire channels of a second switch circuit of the two switch circuits to allow the two switch circuits to be connected between the input end of the single live line and the output end of the single live line; and the control method comprises the following steps:

when the switch units of the two switch circuits are connected to an identical wire channel of the two wire channels, a load is turned on and the two switch circuits obtain a power through the on-state power obtaining circuit to charge the energy storage element; and when the switch units of the two switch circuits are connected to different wire channels of the two wire channels, the load is turned off and the two switch circuits obtain the power through the off-state power obtaining circuit to charge the energy storage element.

15. The control method of the single live line switch circuit of claim 14, wherein the two switch circuits obtain the power in a positive half cycle and a negative half cycle of an external alternating current (AC) input received by the single live line switch circuit, respectively.

* * * * *